(12) United States Patent
Nakayama et al.

(10) Patent No.: US 6,347,105 B1
(45) Date of Patent: Feb. 12, 2002

(54) LASER CONTROL APPARATUS WITH A CURRENT DETECTING AND INTERRUPTING SYSTEM

(75) Inventors: Tomobumi Nakayama, deceased, late of Tokyo, by Kazumi Nakayama, legal representative; Michiharu Masuda, Numazu; Hisatsugu Tahara, Kawasaki; Akio Ito, Machida; Yukio Yokoyama, Mishima, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/411,393

(22) Filed: Oct. 4, 1999

(30) Foreign Application Priority Data

Oct. 5, 1998 (JP) .......................................... 10-282599

(51) Int. Cl.[7] ................................................. H01S 3/00
(52) U.S. Cl. ............................... 372/38.07; 372/38.01; 372/29.014; 372/29.015; 372/29.011
(58) Field of Search ............................... 372/38.01–39, 372/29.01–30, 33, 20

(56) References Cited

U.S. PATENT DOCUMENTS

| | | | | |
|---|---|---|---|---|
| 4,237,427 A | * | 12/1980 | Holland ...................... | 331/94.5 |
| 4,862,466 A | * | 8/1989 | Eguchi ........................... | 372/9 |
| 4,985,896 A | * | 1/1991 | Kimizuka et al. ............ | 372/38 |
| 5,515,395 A | * | 5/1996 | Teremy ....................... | 372/38 |
| 5,965,869 A | | 10/1999 | Masuda et al. ............. | 250/205 |
| 5,991,320 A | | 11/1999 | Nakayama ................... | 372/38 |
| 6,144,680 A | * | 11/2000 | Kaji et al. ..................... | 372/38 |

FOREIGN PATENT DOCUMENTS

JP          7-199096          8/1995

* cited by examiner

Primary Examiner—James W. Davie
Assistant Examiner—Davienne Monbleau
(74) Attorney, Agent, or Firm—Fitzpatrick, Cella, Harper & Scinto

(57) ABSTRACT

An image forming apparatus is arranged to form an image with laser light emitted from a semiconductor laser source, and is constructed so as to protect the laser source from a breakdown, by regulating electric current flowing to the laser source no matter when an adjusting circuit for adjusting the light amount of the semiconductor laser source is apt to supply the electric current that could break the laser source, to the laser source. The apparatus is constructed in such structure that during an automatic light amount control period the laser light amount emitted from the semiconductor laser source is detected and a current source circuit is made inactive when the light amount detected is over a set light amount and that during periods other than the control period the electric current flowing to the semiconductor laser is detected and the current source circuit is made inactive when the light amount detected becomes over a fixed ratio times the current detected during the automatic light amount control period. In this way, the protection circuit can operate effectively anytime of emission of the laser source, so as to protect the laser source from the breakdown.

13 Claims, 4 Drawing Sheets

LASER CONTROL APPARATUS WITH A CURRENT DETECTING AND INTERRUPTING SYSTEM

BACKGROUND OF THE INVENTION

1. Field of the Invention

The present invention relates to a laser control apparatus, an image forming apparatus for forming an image with light emitted from a laser, and a copier incorporating the image forming apparatus.

2. Related Background Art

The applicant of the basic application filed in Japan filed Japanese Patent Application Laid-Open No. 7-199096 to disclose the invention of the image forming apparatus for forming an image with laser light emitted from a plurality of laser sources, which is provided with a means for controlling laser beams emitted in time division from the laser sources, at a constant light amount by use of light amount detectors numbering less than the number of laser sources.

In this invention, electric current supplied to the laser sources is controlled in order to control the laser beams emitted from the laser sources at the constant light amount, and in this control, where a value of the electric current to be supplied reaches a region where the laser sources can be destroyed, there is no way of limiting it. Potential causes of the increase in the electric current to be supplied include a malfunction, a breakdown, etc. of circuitry in a control system. In such events, the control system sets high electric current to be supplied to the laser source, so that the laser source may be damaged.

SUMMARY OF THE INVENTION

An object of the present invention is, therefore, to protect the laser sources from the breakdown, by regulating the electric current flowing in the laser source whenever the means for adjusting the amount of light from the laser source is about to supply the electric current high enough to destroy the laser source, to the laser source.

A laser control apparatus according to the present invention comprises a light source, light amount detecting means for detecting an amount of light emitted from the light source and outputting a light amount detection value, sample and hold means for sampling and holding the light amount detection value, light amount control means for carrying out a negative feedback control of the light amount in accordance with a difference between the light amount detection value and a reference value during a control period in which the light source emits the light and in which the light does not effect writing of a photosensitive member, first comparing means for comparing the light amount detection value with a predetermined value and outputting a first effective comparison output only when the sample and hold means is in a sample state, electric current detecting means for detecting an electric current flowing to the light source and outputting an electric current detection value, electric current detection value holding means for holding an increased value of said current detection value in the control period of the light amount control means, second comparing means for comparing the increased value held by the detection value holding means with a present value of said current detection value and outputting a second effective comparison output only when the sample and hold means is in a hold state, and current interrupting means for interrupting the electric current flowing to the light source in accordance with the first or second effective comparison output.

The laser control apparatus according to the present invention comprises plural sets of the light source, the sample and hold means, the light amount control means, the first comparing means, the current detecting means, the current detection value holding means, the second comparing means, and the current interrupting means, the number of the light amount detecting means is smaller than the number of light sources, and the light amount detecting means is utilized in time division.

An image forming apparatus according to the present invention is an image forming apparatus for writing image data on a photosensitive member with the light emitted from the light source, converting the image data into a visible image, and transferring the visible image onto a transfer sheet to form an image thereon, using the above laser control apparatus.

A copier according to the present invention is one comprising the above image forming apparatus.

DETAILED DESCRIPTION OF THE PREFERRED EMBODIMENTS

Figure 1:
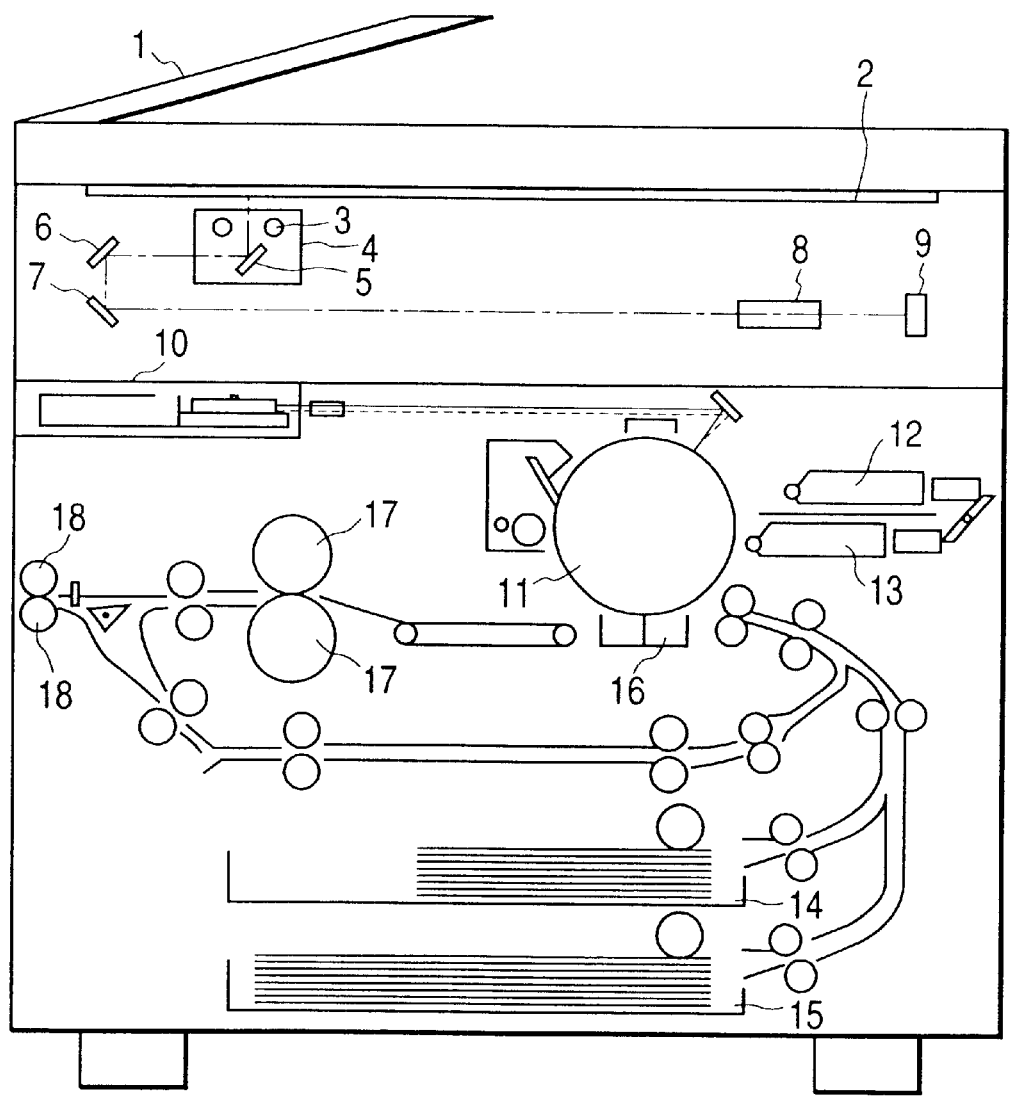
FIG. 1 is a cross-sectional view of an image forming apparatus according to the present invention.

The present invention will be described based on the embodiments illustrated in the drawings. FIG. 1 is a conceptual, sectional view of the whole apparatus to show an example of a copier incorporating the image forming apparatus according to the present invention. The fundamental operation will be described referring to FIG. 1. Originals placed on one original feeder are successively transferred one by one onto a surface 2 of an original glass plate. When an original is mounted on the surface 2, a lamp 3 as a light source of a scanner section is turned on and a scanner unit 4 moves to illuminate the original. Reflected light from the original travels via mirrors 5, 6, 7 and through a condenser lens 8, and thereafter is incident to an image sensor part 9. An image signal inputted into the image sensor part 9 is read out directly, or is stored once in a n image memory not illustrated and thereafter read out. An exposure control section 10 has two semiconductor lasers, as detailed hereinafter, and drives each of the semiconductor lasers according to the above image signal, whereby two laser beams modulated according to the image signal simultaneously and linearly scan a photosensitive drum 11 to form a latent image on the photosensitive drum 11. The exposure control section 10 repeatedly carries out this operation during rotation of the photosensitive drum 11 to form a latent image of one page on the photosensitive drum. The latent image formed on the photosensitive drum by exposure is developed by a developing unit 12 or a developing unit 13 retaining toner. A transfer sheet is conveyed from a transfer sheet mount 14 or from a transfer sheet mount 15 while being timed with the latent image, and the toner image developed is transferred onto the transfer sheet in a transfer section 16. The toner image transferred onto the transfer sheet is fixed thereon in a fixing section 17, and thereafter the transfer sheet is discharged from a discharge section 18 to the outside of the apparatus.

Figure 2:
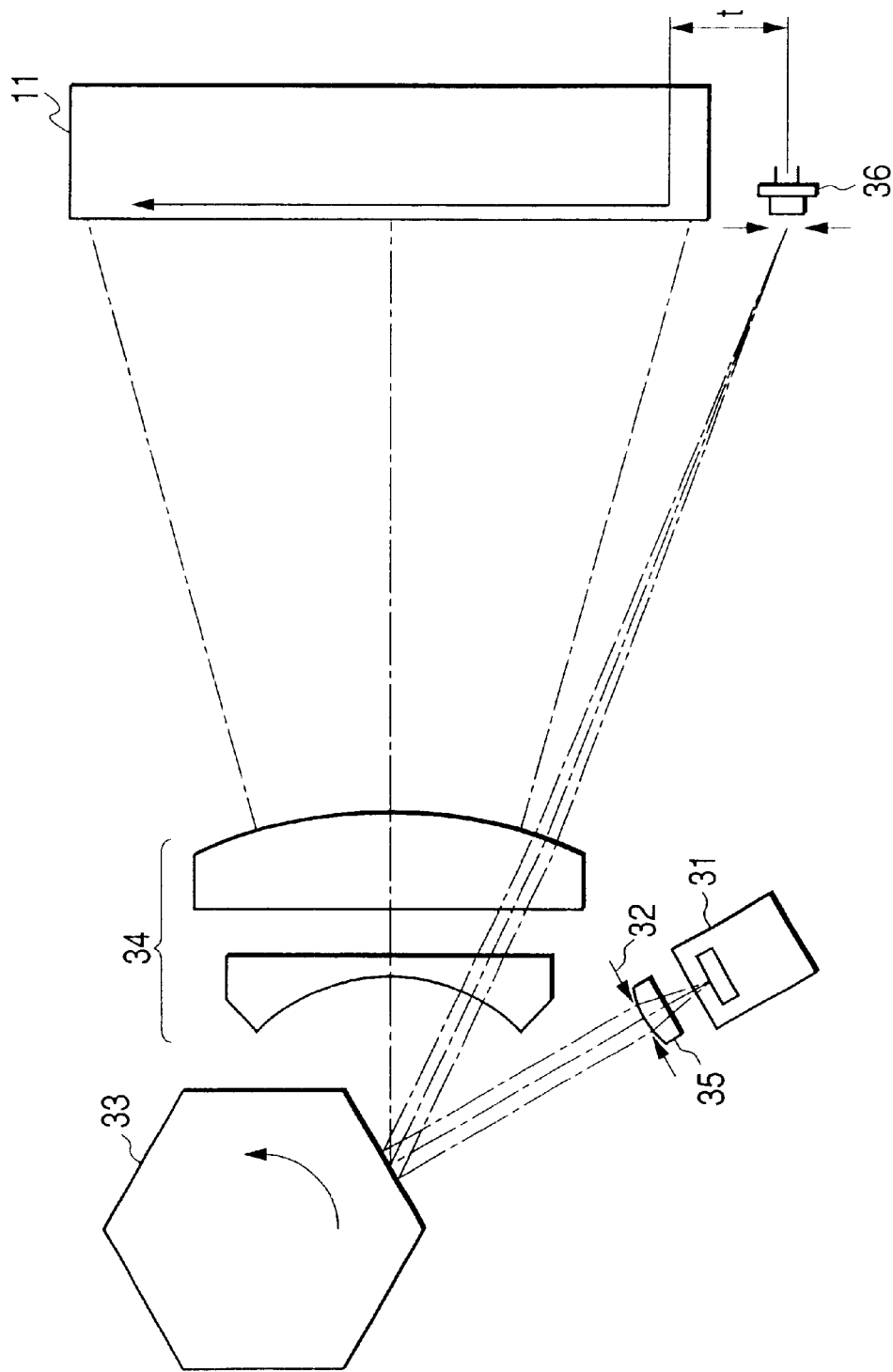
FIG. 2 is an optical, structural diagram in an exposure control section of FIG. 1.

FIG. 2 shows the conceptual structure of the major part of the exposure control section 10 of FIG. 1. In the drawing reference numeral 31 designates a twin laser having two light sources 59, 60, which is, for example, a semiconductor twin laser. Inside the twin laser 31, a photodiode 58 (FIG. 3) is provided as a light amount detecting means for detecting the light amount of part of the laser light from each of the semiconductor lasers. A control for keeping the light amount of each semiconductor laser constant is carried out using a detection signal of the photodiode 58 (this control will be referred to as APC). Each of the laser beams emitted from the twin laser 31 is collimated into an almost parallel beam by collimator lens 35 and stop 32 and the almost parallel beams having a predetermined beam diameter are incident to a rotary polygon mirror 33.

The rotary polygon mirror 33 undergoes rotation at equal angular velocity in a direction as indicated by a curved arrow, and with this rotation the light beams of the twin laser 31 incident thereto are reflected in the form of deflected beams continuously changing angles. The light of the deflected beams experiences condensing action of f-θ lens 34. On the other hand, since the f-θ lens 34 also effects such correction for distortion as to ensure temporal linearity of scanning at the same time, the light beams are coupled to scan the area on the photosensitive member 11 as an image carrier at equal speed in a direction indicated by a linear arrow in the figure. Numeral 36 denotes a beam detect (hereinafter abbreviated as BD) sensor for detecting the reflected light from the rotary polygon mirror 33, and a detection signal (BD signal) of the BD sensor 36 is used as a synchronizing signal for synchronization between the rotation of the rotary polygon mirror 33 and writing of data.

Here the structure according to the present invention will be described referring to FIG. 3. In the description hereinafter, circuits for the side of the semiconductor laser 59 will be explained without parentheses, whereas circuits for the side of the semiconductor laser 60 with parentheses.

Figure 3:
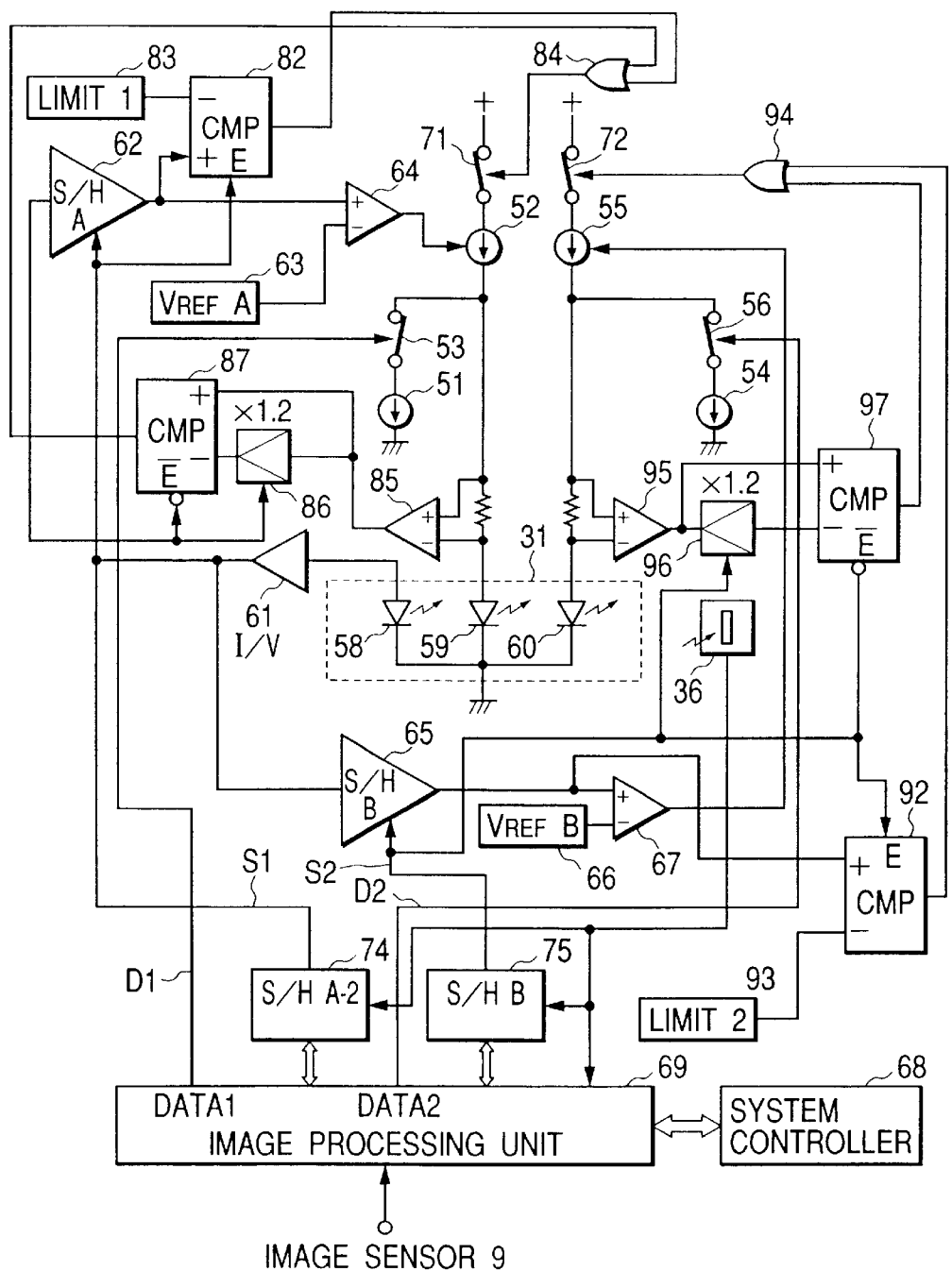
FIG. 3 is a diagram to explain the structure and operation of Embodiment 1 of laser control circuitry according to the present invention.

FIG. 3 is a block diagram to show the structure of control circuitry for controlling the twin laser of the present embodiment. In FIG. 3, a system controller 68 is a control circuit for controlling each section of the apparatus of FIG. 1, and an image processing unit 69 is a circuit for processing image signals read in the image sensor part 9 of FIG. 1. The image processing unit 69 functions to supply the image signals from the image sensor part 9 (FIG. 1) to a laser driving circuit two lines at a time in synchronization with the BD signal or to output a signal for the APC control of the two semiconductor lasers as described hereinafter. Each control signal generating unit 74 (75) is a circuit for generating a timing signal necessary for pulling of the APC control of the two semiconductor lasers. Numeral 31 enclosed in a dashed line represents the twin laser illustrated in FIG. 2, which is comprised of the semiconductor lasers 59 (60) and the photodiode 58 for detecting part of the laser light from these semiconductor lasers. The photodiode 58 equally receives part of the laser light emitted from the semiconductor laser 59 and part of the laser light emitted from the semiconductor laser 60. The photodiode 58 functions as a light amount sensor for the semiconductor laser 59 while only the semiconductor laser 59 is emitting the light; whereas it functions as a light amount sensor for the semiconductor laser 60 while only the semiconductor laser 60 is emitting the light. Numeral 36 denotes the BD sensor illustrated in FIG. 2, which is used for detection of the synchronization signal.

A bias current source 51 (54) and a total current source 52 (55) are current sources used for the control of the semiconductor laser 59 or 60.

Figure 4:
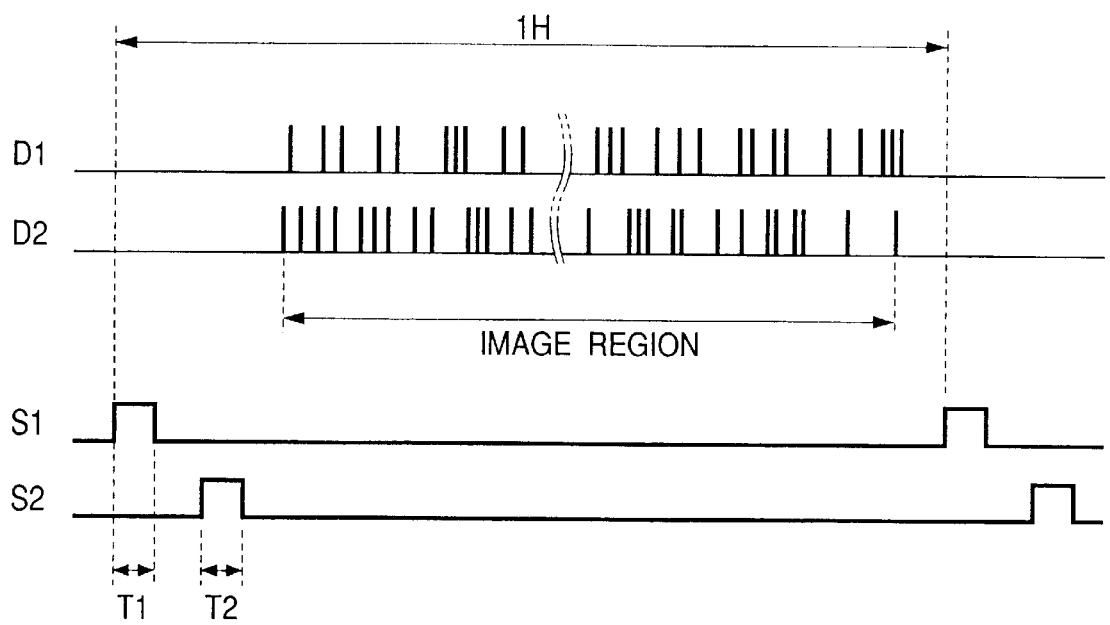
FIG. 4 is a timing chart of Embodiment 1 of the laser control according to the present invention.

A switch 53 (56) is a switch which is turned on or off according to the image signal in an image region (FIG. 4). The switch 53 (56) is turned off with input of a HIGH level signal and the semiconductor laser 59 (60) is turned on by total current supplied from the total current source 52 (55). The switch 53 (56) is turned on with input of a LOW level signal from an output terminal DATA1 (DATA2) of the image processing unit 69, whereupon the total current of the total current source 52 (55) is supplied to the bias current source 51 (54). As a result, the current supplied to the semiconductor laser 59 (60) becomes below the current enough for lasing, and thus the semiconductor laser 59 (60) is turned off. The semiconductor laser 59 (60) is driven by controlling the switch 53 (56) according to the image signal in this way, thereby effecting optical writing in the photosensitive drum 11.

A switch 71 (72) is a switch whose on/off is controlled by a logical OR between an output of comparator circuit 87 (97) and an output of comparator circuit 82 (92). This logical OR is made in an OR circuit 84 (94). When an output voltage level of the OR circuit 84 (94) becomes HIGH, the switch 71 (72) is opened, so as to interrupt the total current source 52 (55) and make it inactive.

In the normal line APC control of the laser diode 59 (60) carried out every horizontal scanning, the switch 53 (56) is off while the switch 56 (53) is on during a control time T1 (FIG. 4) (T2 (FIG. 4)) in a non-image region, whereby only the laser 59 (60) is on. In synchronization therewith a sample and hold circuit 62 (65) is turned into a through state. The state of the sample and hold circuit is normally either a sample state or a hold state and the present embodiment employs the term "through state" instead of the term "sample state," because voltage levels of signals through the sample and hold circuit vary during sample periods and the principal purpose is the APC accompanied by this variation. At this time part of the laser light of only the laser 59 (60) is detected by the photodiode 58 (58) and the signal is converted into a voltage signal by a current-voltage converter (I/V) 61 (61). This signal after the conversion passes through the sample and hold circuit 62 (65) in the through state and is supplied to an operational amplifier 64 (67). The operational amplifier 64 (67) compares an output signal of the sample and hold circuit 62 (65) with a reference voltage of a reference voltage generator 63 (66) and controls the current of the total current source 52 (55) according to a different signal between them. Namely, the APC control is carried out so that the light amount of the laser 59 (60) becomes a desired light amount by controlling the current of the total current source 52 (55) so as to accomplish the target light amount set as a reference voltage by the reference voltage generator 63 (66).

On the other hand, in the image region, the output signal of the current-voltage converter (I/V) 61 during the control period is held in the sample and hold circuit 62 (65), and the light amount of the semiconductor laser 59 (60) is continuously controlled at a constant value by the signal held by the operational amplifier 64 (67) and the reference voltage generated by the reference voltage generator 63 (66).

Next described is the protection of the semiconductor lasers in the present embodiment.

The output of the sample and hold circuit 62 (65) is connected to the positive input terminal of the comparator 82 (92) of the first comparing means. While the sample and hold circuit 62 (65) is in the through state during the control period T1 (FIG. 4) (T2 (FIG. 4)), the voltage level of the sample hold signal inputted into the comparator circuit 82

(92) is HIGH, so that the comparator circuit 82 (92) becomes ready for action (in a state capable of outputting the HIGH level). Therefore, the comparator circuit 82 (92) is a circuit capable of performing the comparing operation only in the through state during the control period T1 (T2). A limit voltage holding circuit 83 (93) holds a limit voltage set corresponding to a light amount over which the semiconductor laser 59 (60) could be broken. The limit voltage outputted from this limit voltage holding circuit 83 (93) is connected to the negative input terminal of the comparator circuit 82 (92). The comparator circuit 82 (92) carries out a comparison between the output of the sample and hold circuit 62 (65) and the output of the limit voltage holding circuit 83 (93) only during the control period T1 (T2) in which the sample and hold circuit 62 (65) is in the through state. When the output of the sample and hold circuit 62 (65) becomes higher than the limit voltage outputted from the limit voltage holding circuit 83 (93) at this time, the output voltage level of the comparator circuit 82 (92) becomes HIGH, which is inputted into the OR circuit 84 (94). Then the switch 71 (72) of the total current source 52 (55) is turned off to interrupt the current supplied to the semiconductor laser 59 (60). Namely, lighting of the laser is suspended when the light amount of the laser is apt to reach the breakdown area during the period T1 (T2) in which the total current from the total current source 52 (55) is adjusted. The output voltage level of the comparator circuit 82 (92) is continuously kept LOW during periods except for the period T1 (T2).

Next described is the operation during the hold state of the sample and hold circuit 62 (65). During the hold state the above operation of the comparator 82 (92) is inhibited. Numeral 85 (95) represents a differential amplifier, which detects the electric current flowing to the laser 59 (60) by measuring voltage at the both ends of a resistor placed between the input terminals. An output of the differential amplifier 85 (95) corresponding to the current flowing to the semiconductor laser 59 (60), detected by the differential amplifier 85 (95), is inputted into a sample and hold circuit 86 (96) having a 1.2-fold gain. The output of the differential amplifier 85 (95) is also inputted into the comparator circuit 87 (97). The sample and hold circuit 86 (96) having the 1.2-fold gain carries out the sample and hold operation in synchronization with the sample and hold circuit 62 (65), so that the sample and hold circuit 86 (96) holds the voltage equal to 1.2 times the output voltage of the differential amplifier 85 (95) corresponding to the electric current flowing to the semiconductor laser 59 (60), determined by the APC control. The comparator 87 (97) is a comparator which carries out the comparing operation only during the hold state. The comparator circuit 87 (97) compares the voltage of 1.2 times the output voltage of the differential amplifier 85 (95) corresponding to the current amount flowing to the semiconductor laser 59 (60), determined by the aforementioned APC control during the hold, with the output voltage of the differential amplifier 85 (95) corresponding to the electric current actually flowing to the semiconductor laser 59 (60) during the hold. When the electric current actually flowing becomes not less than 1.2 times the electric current determined by APC, the output voltage level of the comparator circuit 87 (97) becomes HIGH, which is inputted into the OR circuit 84 (94). As a result, the output voltage level of the OR circuit 84 (94) becomes HIGH to be inputted into the switch 71 (72). With this input the switch 71 (72) of the total current source 52 (55) becomes off to interrupt the current supplied to the semiconductor laser 59 (60). Namely, lighting of the laser 59 (60) is suspended when the light amount of the laser is apt to reach the breakdown region of 1.2 times the amount determined by APC during the hold.

Although the present embodiment employs the 1.2-fold gain of the sample and hold circuit 86 (96), this gain is not limited to this value, but it should be determined so as to specify the upper limit of the current for keeping the semiconductor laser 59 (60) from the breakdown and so as to prevent occurrence of a malfunction.

Since the adjustment of the light amount of the semiconductor lasers is carried out during the period T1 for the semiconductor laser 59 and during the period T2 for the semiconductor laser 60 as illustrated in FIG. 4, the photodiode 58 and the current-voltage converter (I/V) 61 are utilized in time division, and thus one system of these elements suffices for the apparatus.

As described above, the present invention is directed to the image forming apparatus for forming the image with the laser light emitted from the semiconductor laser sources, which is constructed so as to protect the laser sources from the breakdown, by regulating the electric current flowing to the laser sources no matter when the means for adjusting the light amount of the semiconductor laser sources is apt to supply the electric current that could break the laser source, to the laser source.

For accomplishing it, the present invention provides the apparatus constructed in such structure that during the automatic light amount control period the laser light amount emitted from the semiconductor laser source is detected and the current source circuit is made inactive when the light amount detected is over the set light amount and that during the periods other than the control period the electric current flowing to the semiconductor laser is detected and the current source circuit is made inactive when the light amount detected becomes over the fixed ratio times the current detected during the automatic light amount control period.

In this way, the present invention permits the protection circuit to operate effectively anytime of emission of the laser sources, so as to protect the laser sources from the breakdown.

What is claimed is:

1. A laser control apparatus comprising:

a light source;

light amount detecting means for detecting an amount of light emitted from said light source and outputting a light amount detection value;

sample and hold means for sampling and holding said light amount detection value;

light amount control means for carrying out a negative feedback control of said light amount according to a difference between said light amount detection value and a light amount reference value during a control period in which said light source emits the light and in which said sample and hold means is in a sample state;

first comparing means for comparing said light amount detection value with a maximum permissible light amount and outputting a first effective comparison output during a period of said negative feedback control;

current detecting means for detecting an electric current flowing to said light source and outputting a current detection value;

current detection value holding means for holding an increased value of said current detection value during the period of said negative feedback control;

second comparing means for comparing said increased value with a present value of said current detection value during periods except for the period of said negative feedback control and outputting a second effective comparison output; and current interrupting means for interrupting the current flowing to said light source in accordance with said first or second effective comparison output.

2. The laser control apparatus according to claim 1, further comprising plural sets of said light source, wherein the number of said light amount detecting means is smaller than the number of said plural sets of said light source, and wherein said light amount detecting means is utilized in time division.

3. A laser control apparatus comprising:

a light source;

light amount detecting means for detecting an amount of light emitted from said light source;

light amount adjusting means for automatically controlling the amount of the light emitted from said light source in accordance with an output of said light amount detecting means;

first protecting means for making a current source circuit of the light source inactive when the light amount becomes over a set light amount during a period of said automatic control; and second protecting means for making the light source circuit inactive when an electric current flowing to the light source during periods except for the period of said automatic control becomes over a fixed ratio times an electric current determined during the period of said automatic control.

4. The laser control apparatus according to claim 3, further comprising plural sets of said light source, wherein the number of said light amount detecting means is smaller than the number of said plural sets of said light source, and wherein said light amount detecting means is utilized in time division.

5. The laser control apparatus according to either one of claims 1 to 4, wherein said laser control apparatus is embodied within an image forming apparatus for writing image data on a photosensitive member with the light emitted from the light source.

6. A laser control apparatus comprising:

current supply means for supplying an electric current to a light source;

light amount detecting means for detecting an amount of light emitted from the light source;

current control means for controlling the electric current supplied to the light source in accordance with a detection result of said light amount detecting means;

current detecting means for detecting the electric current supplied to the light source;

monitor means for monitoring an abnormality state of the light source based on a detection result of said light amount detecting means or said current detecting means; and protecting means for protecting the light source based on monitoring result of said monitor means.

7. A laser control apparatus according to claim 6 further comprising current holding means for holding the electric current controlled by said current control means.

8. A laser control apparatus according to claim 7, wherein said monitor means monitors an abnormality state of the light source based on a detection result of said light amount detecting means in a period when said current holding means is not in a holding state, while said monitor means monitors an abnormality state of the light source based on a detection result of said current detecting means in a period when said current holding means is in a holding state.

9. A laser control apparatus according to claim 6, further comprising plural sets of said current supply means, wherein a single unit of said light amount detecting means is used in common for the plurality of light sources.

10. A laser control apparatus comprising:

current supply means for supplying an electric current to a light source;

light amount detecting means for detecting an amount of light emitted from the light source;

current control means for controlling the electric current supplied to the light source in accordance with a detection result of said light amount detecting means;

current detecting means for detecting the electric current supplied to the light source;

first protecting means for protecting the light source based on a detection result of said light amount detecting means; and second protecting means for protecting the light source based on a detection result of said current detecting means.

11. A laser control means according to claim 10, further comprising current holding means for holding the electric current controlled by said current control means.

12. A laser control apparatus according to claim 11, further comprising activating means for activating said first protecting means in a period when said current holding means is not in a holding state, while activating said second protecting means in a period when said current holding means is in a holding state.

13. A laser control apparatus according to claim 10, further comprising plural sets of said current supply means, wherein a single unit of said light amount detecting means is used in common for the plurality of light sources.

\* \* \* \* \*

UNITED STATES PATENT AND TRADEMARK OFFICE
CERTIFICATE OF CORRECTION

PATENT NO.   : 6,347,105 B1
DATED        : February 12, 2002
INVENTOR(S)  : Tomobumi Nakayama et al.

It is certified that error appears in the above-identified patent and that said Letters Patent is hereby corrected as shown below:

Column 2,
Line 49, "a n" should read -- an --.

Column 8,
Line 6, "monitoring" should read -- a monitoring --.

Signed and Sealed this

Seventeenth Day of December, 2002

JAMES E. ROGAN
*Director of the United States Patent and Trademark Office*